(12) United States Patent
Lee et al.

(10) Patent No.: US 8,835,519 B2
(45) Date of Patent: Sep. 16, 2014

(54) SHEET FOR A SEALING MEMBER OF A SOLAR CELL, AND METHOD FOR PREPARING SAME

(75) Inventors: Jong-Hun Lee, Seongnam-si (KR); Chul-June Choi, Daejeon (KR); Sung-Yong Kang, Anyang-si (KR); Min-Hee Lee, Gunpo-si (KR)

(73) Assignee: LG Hausys, Ltd., Seoul (KR)

( * ) Notice: Subject to any disclaimer, the term of this patent is extended or adjusted under 35 U.S.C. 154(b) by 0 days.

(21) Appl. No.: 13/988,257

(22) PCT Filed: Nov. 22, 2011

(86) PCT No.: PCT/KR2011/008919
§ 371 (c)(1),
(2), (4) Date: May 17, 2013

(87) PCT Pub. No.: WO2012/070842
PCT Pub. Date: May 31, 2012

(65) Prior Publication Data
US 2013/0245146 A1    Sep. 19, 2013

(30) Foreign Application Priority Data
Nov. 23, 2010 (KR) .................. 10-2010-0117093

(51) Int. Cl.
| | | |
|---|---|---|
| *C09J 131/04* | (2006.01) | |
| *H01L 31/042* | (2014.01) | |
| *H01L 31/048* | (2014.01) | |
| *C09J 7/00* | (2006.01) | |
| *C09J 123/06* | (2006.01) | |
| *C09J 123/08* | (2006.01) | |

(52) U.S. Cl.
CPC .............. *C09J 123/06* (2013.01); *C09J 131/04* (2013.01); *H01L 31/042* (2013.01); *C09J 7/00* (2013.01); *C09J 123/0853* (2013.01); *C09J 2400/24* (2013.01); *C09J 2423/00* (2013.01); *C09J 2203/322* (2013.01); *H01L 31/0481* (2013.01); *C09J 2201/61* (2013.01); *Y02E 10/50* (2013.01)
USPC ............................. 521/52; 136/243

(58) Field of Classification Search
CPC ..................... B32B 17/1055; B32B 17/10944; C09J 131/04; C09J 123/06; C09J 123/12; H01L 31/0203; H01L 31/048; Y02E 10/50; Y02E 10/50

USPC ............................................. 521/52; 136/243
See application file for complete search history.

(56) References Cited

U.S. PATENT DOCUMENTS

| | | |
|---|---|---|
| 2007/0251572 A1 | 11/2007 | Hoya et al. |
| 2007/0267059 A1 | 11/2007 | Nishijima et al. |
| 2008/0108757 A1 | 5/2008 | Hoya et al. |
| 2009/0165847 A1 | 7/2009 | Mori et al. |
| 2011/0045287 A1 | 2/2011 | Kawashima et al. |

FOREIGN PATENT DOCUMENTS

| | | |
|---|---|---|
| JP | 2002043598 | 2/2002 |
| JP | 2002363507 | 12/2002 |
| JP | 2009218465 A | 9/2009 |
| JP | 2010219205 | 9/2010 |
| JP | 2010226054 A | 10/2010 |
| JP | 2011023415 | 2/2011 |
| KR | 1020070086626 | 8/2007 |
| KR | 1020080078852 | 8/2008 |
| KR | 1020080104050 | 11/2008 |
| KR | 1020090006197 | 1/2009 |
| KR | 1020100122113 | 11/2010 |
| WO | 0161763 A1 | 8/2001 |

OTHER PUBLICATIONS

Engineered Polymers Corp Trade sheet for Ultra High Molecular Weight Polyethylene, taken from the World Wide Web on Feb. 23, 2014. http://chemyq.com/En/xz/xz1/613xflfo.htm.*
International Search Report mailed May 22, 2012 for PCT/KR2011/008919.

* cited by examiner

*Primary Examiner* — Nathan M Nutter
(74) *Attorney, Agent, or Firm* — Lowe Hauptman & Ham, LLP (57) ABSTRACT

Disclosed is a method for preparing a sheet for a sealing member of a solar cell, wherein the sheet has significantly low thermal shrinkage and high flexibility, and a superior capability of discharging bubbles during the manufacture of a solar cell module. The method for preparing a sheet for a sealing member of a solar cell according to the present invention comprises the following steps: (a) preparing a thermal adhesive resin having an olefin-based resin as a main component; (b) pulverizing the thermal adhesive resin and dispersing the resin powder; and (c) heating the thermal adhesive resin powder at a temperature lower than the melting temperature of the resin powder so as to prepare a sheet having a plurality of voids.

12 Claims, 8 Drawing Sheets

SHEET FOR A SEALING MEMBER OF A SOLAR CELL, AND METHOD FOR PREPARING SAME

TECHNICAL FIELD

The present invention relates to a sheet for a sealing member of a solar cell, and a method for producing the same, and more specifically to a sheet for a sealing member of a solar cell that has significantly low thermal shrinkage, high flexibility and an outstanding ability to release bubbles during production.

BACKGROUND ART

Global issues, such as environmental problems and energy problems, have become more serious. Under such circumstances, solar cells using a clean and inexhaustible energy source have received a great deal of attention. Solar cells are generally used in the form of modules under outdoor conditions, for example, on the roofs of buildings.

Figure 1:
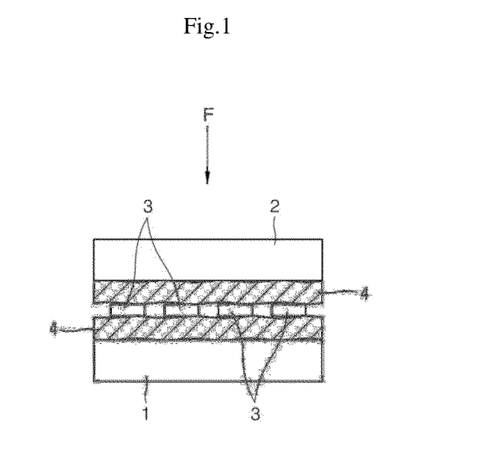
FIG. 1 is a view illustrating the construction of a general solar cell in which sheets are not thermally melted.

Such a solar cell is illustrated in FIG. 1. The solar cell is fabricated by stacking a first sheet 4 for a sealing member on the surface of a front protective member 1, stacking a plurality of solar cell devices 3 on the sheet 4, stacking a second sheet 4 on the solar cell devices, and stacking a rear protective member 2 on the second sheet 4. The first sheet 4 is made of a thermal adhesive resin, and each of the protective members 1 and 2 is made of glass or a resin.

Figure 2:
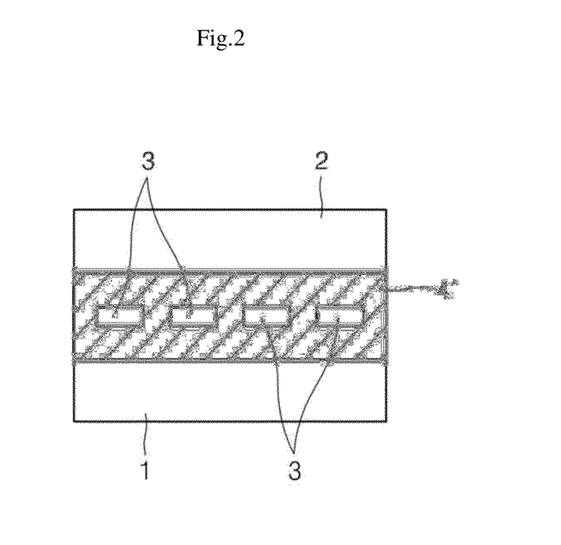
FIG. 2 is a cross-sectional view illustrating the construction of a general solar cell.

The laminate is fabricated by pressing the two protective members 1 and 2 together under heat and melting the two sheets 4 to integrate the protective members with the sheets. FIG. 2 illustrates a finished solar cell module fabricated by integrating the two sheets 4 in a molten state with the other members. The integrated sheets 4 form a sealing member 4'.

Each of the sheets 4 is often produced by extrusion or calendaring molding of a thermal adhesive resin sheet through a T die. The thermal adhesive resin sheet is stretched in the machine direction and exhibits high thermal shrinkage. For these reasons, the thermal adhesive resin sheet used as the sheet 4 suffers from severe shrinkage during thermal melt-bonding. This shrinkage causes misalignment in the position of the solar cell devices 3 or application of stress to the solar cell devices 3, leading to damage to the solar cell devices 3.

Bubbles containing harmful gases are generated in the course of stacking and laminating the sheets, the solar cell devices and the protective members. The bubbles can be removed by a vacuum process. The vacuum process for releasing the bubbles from the sheets is time-consuming, entailing an increase in the fabrication cost of the solar cell module.

Bubbles remaining unremoved from the solar cell module tend to contract at low temperature and expand at high temperature when the solar cell is exposed to outdoor conditions for a long time. This repeated contraction and expansion leads to the formation of cracks in the solar cell module and adversely affects the long-term durability and reliability of the product.

DISCLOSURE

Technical Problem

An aspect of the present invention is to provide a method for producing a sheet for a sealing member of a solar cell that exhibits very low thermal shrinkage and is highly flexible compared to sheets for sealing members produced by conventional processes, such as extrusion.

Another aspect of the present invention is to provide a sheet for a sealing member of a solar cell that exhibits very low thermal shrinkage, high flexibility and an outstanding ability to release bubbles containing harmful gases generated during fabrication of a solar cell module.

Technical Solution

In accordance with one aspect of the present invention, a method for producing a sheet for a sealing member of a solar cell includes (a) preparing a thermal adhesive resin containing an olefinic resin as a main component, (b) pulverizing the thermal adhesive resin into a powder and spreading the powder, and (c) heating the thermal adhesive resin powder to a temperature not higher than the melting point of the resin powder to produce a sheet including a plurality of pores.

In accordance with another aspect of the present invention, a sheet for a sealing member of a solar cell includes a thermal adhesive resin containing an olefinic resin as a main component wherein the sheet is produced by melt-bonding the thermal adhesive resin in the form of a powder to form pores therein.

Advantageous Effects

According to the method of the present invention, a sheet for a sealing member of a solar cell is produced by thermal melt-bonding a resin powder at a predetermined temperature to form pores. All harmful gases generated in the course of producing the sheet are released through the pores of the sheet. In addition, the sheet of the present invention exhibits very low thermal shrinkage and is highly flexible, achieving improved productivity in the fabrication of a solar cell module.

The sheet of the present invention is produced by melt-bonding a resin powder rather than by extrusion processing. Melt-bonding allows the sheet of the present invention to have low thermal shrinkage and very high flexibility. In addition, harmful gases generated in the course of fabricating a solar cell module can easily escape through pores of the sheet. Furthermore, the sheet of the present invention has an outstanding ability to release bubbles.

BEST MODE

The above and other aspects, features, and advantages of the invention will become apparent from the detailed description of the following embodiments in conjunction with the accompanying drawings. It should be understood that the present invention is not limited to the following embodiments and may be embodied in different ways, and that the embodiments are given to provide complete disclosure of the invention and a thorough understanding of the invention to those skilled in the art. The scope of the invention is defined only by the claims. Like reference numerals indicate like elements throughout the specification and drawings.

Now, a sheet for a sealing member of a solar cell and a method for producing the sheet according to the present invention will be described in detail with reference to the accompanying drawings.

The sheet of the present invention includes a thermal adhesive resin containing an olefinic resin as a main component. The sheet is produced by melt-bonding the thermal adhesive resin in the form of a powder to form pores therein.

The thermal adhesive resin used in the sheet 4 refers to a resin that exhibits adhesiveness upon heating. Examples of polymers suitable for use in the resin include olefinic resins, polyvinyl butyral, copolymerized nylon, and polyester. Olefinic resins are particularly preferred due to their high processability and good durability.

Olefinic resin is a generic term for a group of polymers which are prepared by polymerization or copolymerization of olefins, such as ethylene, propylene, butadiene or isoprene, or diolefins. Other examples of such olefinic resins include ethylene copolymers with other monomers, such as vinyl acetate and acrylic acid esters, and olefinic ionomers.

The olefinic resin is intended to include both ethylene resins and propylene resins, and specific examples thereof include polyethylene, polypropylene, polymethylpentene, ethylene-vinyl chloride copolymers, ethylene-vinyl acetate copolymers, ethylene-vinyl alcohol copolymers, chlorinated polyethylene, and chlorinated polypropylene.

The ethylene resins are copolymers of ethylene and resins copolymerizable with ethylene.

Examples of such ethylene resins include: copolymers of ethylene and vinyl esters, such as vinyl acetate and vinyl propionate; copolymers of ethylene and unsaturated carboxylic acid esters, such as methyl acrylate, ethyl acrylate, isobutyl acrylate, n-butyl acrylate and methyl methacrylate; copolymers of ethylene and unsaturated carboxylic acids, such as acrylic acid and methacrylic acid; and copolymers of ethylene and monomers in which unsaturated carboxylic acids are partially neutralized with a metal salt, such as sodium, zinc or lithium, or s-olefins, such as propylene, 1-butene, 1-hexene, 1-octene and 4-methyl-1-pentene. These copolymers may be used alone or as a mixture of two or more thereof. Ethylene-vinyl acetate copolymers are preferably used.

Examples of the ethylene resins include, but are not particularly limited to, polyethylene resins, ethylene homopolymers, and copolymers prepared by graft polymerization of vinyl silane compounds onto polyethylene.

The content of ethylene in the ethylene resin used in the sealing sheet 4 is preferably from 60% to less than 90% by weight, more preferably from 65% to 75% by weight, based on the weight of the copolymer.

The presence of ethylene in an amount of less than 60% by weight increases the adhesiveness of the copolymer, which makes it difficult to obtain the copolymer in the form of a powder. Even though a powder of the copolymer is obtained, the flowability of the powder is not sufficient, and as a result, it is difficult to uniformly spread the powder, making it impossible to obtain the sheet 4 in a uniform state. The non-uniform state of the sheet means a state in which the porosity of the resin is partially different or the thickness of the sheet is not constant in all positions. High adhesiveness of the copolymer causes the problem that the sheet may be attached to a processing device, such as a roll or a die, during production, causing difficulties in terms of film-forming processing.

Meanwhile, the presence of ethylene in an amount exceeding 90% by weight leads to poor transparency and flexibility, which make the sheet unsuitable for use in a sealing member of a solar cell.

The propylene copolymer as a main component of the sheet is prepared by copolymerization of propylene and a resin copolymerizable with propylene.

Examples of such propylene copolymers include copolymers of propylene and at least one $C_2$-$C_{20}$ α-olefin other than propylene. As the $C_2$-$C_{20}$ α-olefin, there may be mentioned, for example, ethylene, 1-butene, 1-pentene, 1-hexene, 4-methyl-1-pentene, 1-octene, 1-decene, 1-dodecene, 1-tetradecene, 1-hexadecene, 1-octadecene, or 1-eicosene. A copolymer of ethylene and/or a $C_4$-$C_{10}$ α-olefin is preferably used in the present invention.

The resin used in the sheet of the present invention preferably has a melt mass-flow rate of 1 g/10 min to 50 g/10 min, as measured in accordance with JIS K6924-1.

If the melt mass-flow rate of the resin is lower than 1 g/10 min, the flowability of the resin in a molten state is not good. In this case, there is the risk that interstices may be left or adhesion defects may occur around the edges of the sealing member 4 and the solar cell devices 3.

Meanwhile, if the melt mass-flow rate of the resin is higher than 50 g/10 min, the flowability of the resin is too high. In this case, there is the risk that an adhesive may flow out of the cross sections of the protective members 1 and 2.

One or more additives may be added to further improve the function of the sheet 4 composed of the olefinic resin.

For example, a cross-linking agent may be further added for the purpose of improving the heat resistance, transparency and adhesiveness of the sheet 4 composed of the olefinic resin. As the cross-linking agent, an organic peroxide is preferably used. The 1 hour half-life temperature of the organic peroxide is preferably from 70 to 180° C., particularly preferably from 90 to 160° C. Examples of such peroxides include tert-butyl peroxyisopropyl carbonate, tert-butyl peroxy-2-ethylhexyl carbonate, tert-butyl peroxyacetate, tert-butyl peroxybenzoate, tert-butyl dicumylperoxide, 2,5-dimethyl-2,5-bis(tert-butylperoxy)hexane, di-tert-butylbutylperoxide, 2,5-dimethyl-2,5-bis(tert-butylperoxy)hexyne-1,1-bis(tert-butylperoxy)cyclohexane, methyl ethyl ketone peroxide, 2,5-dimethylhexyl-2,5-bisperoxybenzoate, tert-butyl hydroperoxide, p-methane hydroperoxide, benzoyl peroxide, p-chlorobenzoyl peroxide, tert-butyl peroxyisobutyrate, hydroxyheptyl peroxide, and cyclohexanone peroxide. The organic peroxide is added in an amount of 0.1 to 15 parts by weight, preferably 0.5 to 5 parts by weight, based on 100 parts by weight of the ethylene copolymer.

For better cross-linking efficiency, one or more cross-linking accelerators may be further added. As the cross-linking accelerators, there may be mentioned, for example, triaryl cyanurates, triaryl isocyanurates, and (meth)acrylic esters. The cross-linking accelerators are added in a total amount of 0.05 to 15 parts by weight, preferably 0.1 to 5 parts by weight, based on 100 parts by weight of the ethylene copolymer.

One or more silane coupling agents may be further added for the purpose of improving the adhesiveness of the olefinic resin. Examples of these silane coupling agents include γ-chloropropylmethoxysilane, vinylethoxysilane, vinyltris(β-methoxyethoxy)silane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltriethoxysilane, vinyltrichlorosilane, γ-mercaptopropyltrimethoxysilane, γ-aminopropyltriethoxysilane, and N-γ-(aminoethyl)-γ-aminopropyltrimethoxysilane. The silane coupling agents are added in a total amount of 0.05 to 5 parts by weight, preferably 0.1 to 1 part by weight, based on 100 parts by weight of the ethylene copolymer.

One or more additives selected among UV absorbers, light stabilizers and antioxidants may be further added to protect the olefinic resin against degradation by UV radiation.

Examples of the UV absorbers include: benzophenones, such as 2-hydroxy-4-methoxybenzophenone, 2,2-dihydroxy-4-methoxybenzophenone, 2-hydroxy-4-methoxy-2-carboxybenzophenone, and 2-hydroxy-4-octoxybenzophenone; benzotriazoles, such as 2-(2-hydroxy-3,5-ditert-butylphenyl)benzotriazole, 2-(2-hydroxy-5-methylphenyl)benzotriazole, and 2-(2-hydroxy-5-tert-octylphenyl)benzotriazole; salicylic acid esters, such as phenyl salicylic acid salts, and p-octylphenylsalicylic acid salts; and 2-ethyl-2'-ethoxyoxanilide.

As the light stabilizers, hindered amines are preferred. As the antioxidants, there may be exemplified hindered phenolic antioxidants, phosphorus-based light stabilizers, lactone-based light stabilizers, and sulfur-based light stabilizers. These additives may be added in a total amount of 0.01 to 2 parts by weight, based on 100 parts by weight of the ethylene copolymer. The total amount of the additives added is preferably from 0.03 to 1% by weight, based on the weight of the ethylene copolymer.

The sheet 4 of the present invention includes a plurality of pores because the thermal adhesive resin in the form of a powder is melt-bonded.

Melting of the polymer resin powder means a process in which the polymer resin powder is gradually changed from solid to liquid and thus becomes viscous. This phenomenon occurs when the polymer resin powder is heated to its melting point or above. The melting point of the resin powder may be varied depending on the kind of the polymer resin.

The expression "below the melting point of the resin powder" used herein means below a temperature at which the polymer resin powder is changed into a liquid. That is, the sheet of the present invention is produced by melt-bonding the resin powder particles at a temperature below the melting point.

The sheet of the present invention has better flexibility than conventional sheets for sealing members because the thermal adhesive resin powder is partially melt-bonded. Partial melt-bonding of the resin powder can be adjusted by varying the ratio of the apparent density of the sheet to the pure density of the thermal adhesive resin.

The sheet 4 having pores has high thermal shrinkage and is highly flexible compared to sheets produced by conventional processes, such as thermal pressing or calendaring. The flexibility of the sheet increases with increasing porosity. That is, the flexibility of the sheet increases as the ratio of the apparent density of the sheet to the pure density of the resin decreases.

The apparent density of the sheet 4 is preferably from 20% to 70% of the pure density of the thermal adhesive resin.

If the apparent density of the sheet 4 is less than 20% of the pure density of the resin, the porosity of the sheet is so high that it is difficult to withdraw air through the pores of the sheet 4 during fabrication of a solar cell module, and as a result, bubbles remain in the sealing member 4' produced by melting the sheet 4. Further, if the sheet has too high a porosity, it is difficult to maintain the shape of the sheet, which increases the production cost of the sheet.

Meanwhile, if the apparent density of the sheet exceeds 70% of the pure density of the resin, the porosity of the sheet is lowered, making the sheet unsuitable for use in a sealing member of a solar cell.

Therefore, it is preferred to adjust the apparent density of the sheet of the present invention to 20% to 70% of the pure density of the thermal adhesive resin.

The use of the highly flexible sheet 4 brings about a reduction in the size of interstices between the edges of the solar cell devices 3 and the sheet 4 in the fabrication of a solar cell, thus preventing pores from remaining in the sealing member 4' after thermal adhesion. That is, the number of defects arising from the presence of pores can be reduced.

The apparent density of the sheet 4 may be adjusted by the state of the resin powder spread on a release sheet or the heating temperature and time for melt-bonding the resin powder.

The sheet 4 having pores has a bulky sponge shape compared to sheets for sealing members having no pores. For this reason, the sheet 4 is very cushiony and can relieve the influence of an external force on the solar cell devices 3 interposed between the pair of sheets 4 in the fabrication of a solar cell.

The optimum thickness of the sheet is varied depending on the thickness, size and arrangement of the solar cell devices adhered to the sheet. It is necessary to determine the thickness of the sheet taking into consideration the amount of the resin to prevent the formation of pores in the sealing member 4' after thermal adhesion while firmly adhering the solar cell devices 3 illustrated in FIG. 2 between the two protective members 1 and 2.

Even when the resin is used in an amount sufficient to fill the pores, too small a thickness of the sheet 4 causes insufficient cushioning properties of the sheet and increases the risk of damage to the solar cell devices 3. Too large a thickness of the sheet leads to an increase in the thickness of the sealing member 4', resulting in a reduction in sunlight transmittance. The reduced sunlight transmittance deteriorates the photovoltaic effects of the solar cell. Another problem is that the sealing member 4' may slip off the cross section when the two protective members 1 and 2 are joined to each other.

A detailed description will be given concerning the method for producing the sheet.

The method of the present invention includes (a) preparing a thermal adhesive resin containing an olefinic resin as a main component, (b) pulverizing the thermal adhesive resin into a powder and spreading the powder, and (c) heating the thermal adhesive resin powder to a temperature not higher than the melting point of the resin powder to produce a sheet including a plurality of pores.

In step (a), a thermal adhesive resin containing an olefinic resin as a main component is prepared. The olefinic resin used as a main component of a sheet for a sealing member of a solar cell preferably includes an ethylene resin or a propylene resin. Particularly, the ethylene resin may include a copolymer of ethylene and vinyl acetate as a main component.

In step (b), the thermal adhesive resin is pulverized into a powder and the powder is spread on a release sheet.

The thermal adhesive resin powder constituting the sheet 4 can be obtained by pulverizing pellets of the thermal adhesive resin using a suitable process, such as mechanical, freezing and chemical pulverization. The particle size of the powder is not particularly limited but is preferably from 20 mesh (corresponding to about 864 microns) to 120 mesh (corresponding to about 117 microns) taking into consideration the flowability of the powder and the flexibility of the sheet. More preferably, the particle size of the resin powder is in the range of 30 mesh (corresponding to about 535 microns) to 70 mesh (corresponding to about 200 microns).

If many of the particles have a size exceeding 20 mesh, it is difficult to produce a sheet with a small film thickness, which is not preferable. Meanwhile, if many of the particles have a size of less than 120 mesh, flowability of the powder is poor and it is difficult to produce a sheet with a uniform thickness.

The resin powder is preferably spread in an amount of 300 to 1000 g/m².

When 1 g of the resin powder is spread, the sheet of the present invention may have an area of 1 m² (width×length) and a thickness of 1 μm. Since the sheet of the present invention preferably has a thickness of 300 μm to 1000 μm in its porous state, the necessary amount of the resin powder spread for the production of the sheet may be from 300 to 1000 g/m². The thickness of a solar cell module after lamination may be from about 150 μm to about 400 μm.

More preferably, the porous sheet has a thickness of 500 to 700 μm (when the resin powder is spread in an amount of 500 to 700 g/m²) and a thickness of 150 to 300 μm after lamination.

The thermal adhesive resin powder is uniformly spread in an amount within the range defined above on a release sheet using a suitable machine, such as a powder spreading machine.

If the amount of the resin powder spread is outside the range of 300 g/m² to 1000 g/m², an appropriate thickness of the sheet is not obtained, which increases the number of defects during fabrication of a solar cell module.

The thermal adhesive resin powder is uniformly spread on a release sheet using a suitable machine, such as a powder spreading machine.

In step (c), the thermal adhesive resin powder is heated to a temperature not higher than the melting point of the resin powder to produce a sheet including a plurality of pores.

According to extrusion or calendaring as a conventional process for producing a sheet for a sealing member, a polymer resin is completely melted by heating to above its melting point and the molten polymer resin is molded before solidification. In contrast, according to the method of the present invention, the thermal adhesive resin powder is melt-bonded by heating to a temperature not higher than a melting point thereof.

The melt-bonding of the thermal adhesive resin powder at a temperature not higher than the melting point allows for slight melt-bonding of the surface of the powder to maintain the shape of a sheet. That is, by the melt-bonding of the powder particles at a temperature not higher than the melting point, pores, which have been in the form of particles, are maintained uniformly, enabling the production of a sheet including a plurality of pores.

When the thermal adhesive resin powder is heated above its melting point, the resin powder is completely melted, making it difficult to obtain a desired shape of the sheet and causing a problem that the sheet may stick to a release plate during production.

The melt-bonding of the thermal adhesive resin powder may be performed using a suitable heating device, such as a far infrared heater. The heating temperature is preferably in the range of 80 to 140° C., more preferably 100 to 120° C.

If the heating temperature is lower than 80° C., a portion of the thermal adhesive resin powder may not be sufficiently melt-bonded. That is, the flexibility of the thermal adhesive resin powder exceeds flexibility suitable for a sheet for a sealing member of a solar cell, causing difficulty in the fabrication of a solar cell module. Meanwhile, if the heating temperature exceeds 140° C., substantially all of the resin powder is melt-bonded, making it impossible to obtain suitable flexibility for a sheet for a sealing member and causing a problem that the sheet may stick to a release plate during production.

The thermal adhesive resin powder is melt-bonded and adhered by the heating to form a sheet shape, which is then cooled. Thereafter, the sheet is peeled from the release sheet, completing the production of the sheet according to the present invention.

The sheet 4 of the present invention includes a plurality of pores because it is produced by melt-bonding the thermal adhesive resin powder.

The sheet 4 including pores has high thermal shrinkage and is highly flexible compared to sheets produced by conventional processes, such as thermal pressing or calendaring. The flexibility of the sheet increases with increasing number of the pores.

Bubbles including harmful gases generated during fabrication of a solar cell module easily escape through the pores of the sheet 4 according to the present invention. This reduces the number of defects and can greatly shorten the time needed to remove bubbles, contributing to a reduction in the fabrication cost of a solar cell module.

EXPERIMENTAL EXAMPLES

The sheet 4 for a sealing member according to the present invention will be explained with reference to the following examples and comparative examples. However, these examples are not intended to limit the invention.

Examples

In the following examples, 1 part by weight of tert-butyl peroxy-2-ethylhexyl carbonate as a cross-linking agent having a 1 hour half-life temperature of 119.3° C. and 0.5 parts by weight of γ-methacryloxypropyltrimethoxysilane as a silane coupling agent were mixed with 100 parts by weight of an ethylene-vinyl acetate copolymer containing 28 wt % of vinyl oxide and having a melt mass-flow rate of 18 g/10 min. The mixture was melt-kneaded in an extruder to obtain a thermal adhesive resin. The extruder temperature was set such that the resin temperature reached 100° C.

Thereafter, the thermal adhesive resin was frozen using liquid nitrogen and pulverized to obtain a powder having a particle size of 42 to 200 mesh.

Next, the thermal adhesive resin powder was uniformly spread on a release sheet using a powder spreading machine and heated to 120° C. using a far infrared heater to obtain a sheet 4 for a sealing member in which the resin powder was partially melt-bonded. The sheet 4 had a thickness of 0.7 mm and a weight of 400 g per unit area (cm²).

The sheet was evaluated in terms of the ability to remove bubbles, thermal shrinkage, and flexibility (the ratio of the apparent density to the pure density of the resin). The characteristics of the sheet were compared with those of EVA sheets for sealing members of solar cells produced by other companies to confirm the number of defects arising therefrom.

1. Experiment on the Ability to Remove Bubbles

According to the prior art, the time needed to release bubbles from sheets for sealing members under vacuum is about 5 min. In this experiment, when the conventional processing time was reduced to half or less, the ability of the inventive sheet to release bubbles was confirmed by comparison with that of a comparative sheet.

Glass plates having a width of 500 mm, a length of 500 mm and a thickness of 3.2 t were used as protective members. 9 solar cells and metal electrodes were interposed between the sheets for sealing members to fabricate a solar cell module. The solar cell module was fabricated under the same conditions as an actual module.

The conditions for the fabrication of the module were a pressing temperature of 145° C. and a pressure of 1 atm, which are the same as processing conditions for the fabrication of conventional solar cell modules except the vacuum processing time for releasing bubbles.

A comparative solar cell module was fabricated using an EVA sheet (solar EVA, Mitsui). The experimental results are shown in Table 1.

TABLE 1

| Vacuum time | | 5 min | 3 min | 2 min | 1 min |
|---|---|---|---|---|---|
| Bubbles | Comparative (Mitsui) | Not observed | Not observed | Observed | Observed |
| | Inventive | Not observed | Not observed | Not observed | Not observed |

At the vacuum processing time of 5 min, which is the same as the conventional vacuum processing time for releasing bubbles from solar cell modules, all bubbles were removed from both inventive and comparative solar cell modules. When the vacuum processing time was reduced to 3 min, bubbles were removed from both inventive and comparative solar cell modules.

At the vacuum processing time of 2 min or less, bubbles were removed from the inventive solar cell module whereas bubbles were not completely removed and began to appear in the comparative solar cell module.

Figure 3A:
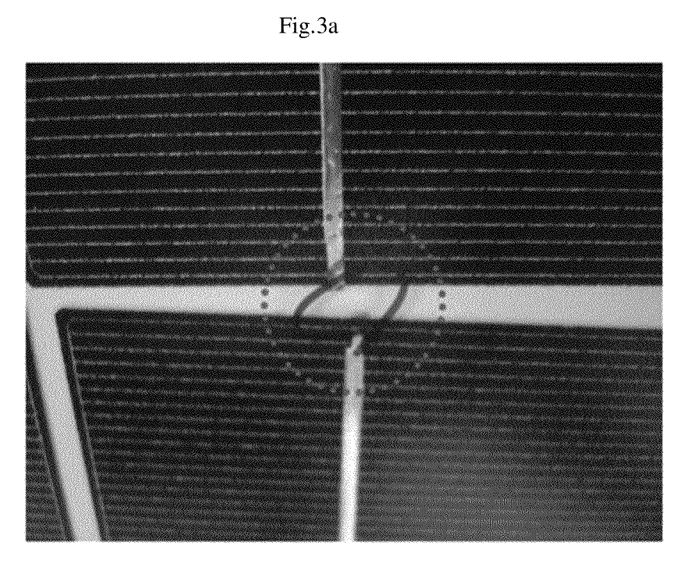
FIGS. 3a to 3e are images showing experimental results for the ability to release bubbles from a solar cell module under vacuum with the passage of time.
Figure 3B:
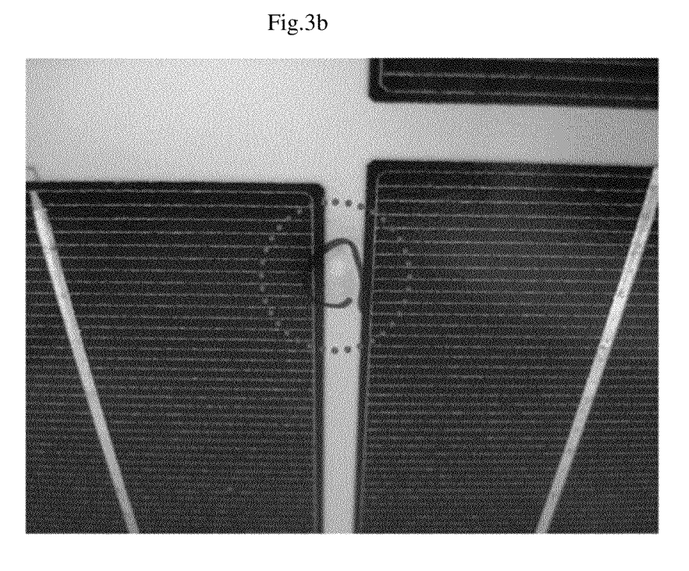
Figure 3C:
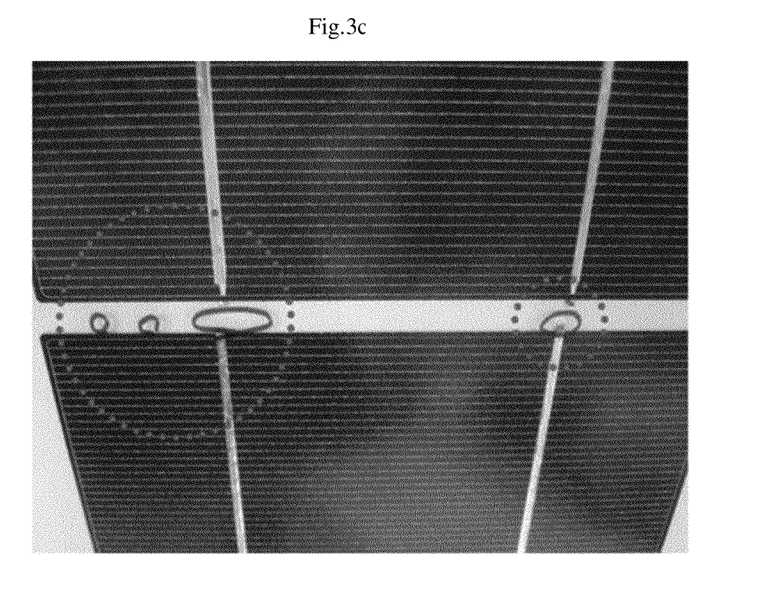
Figure 3D:
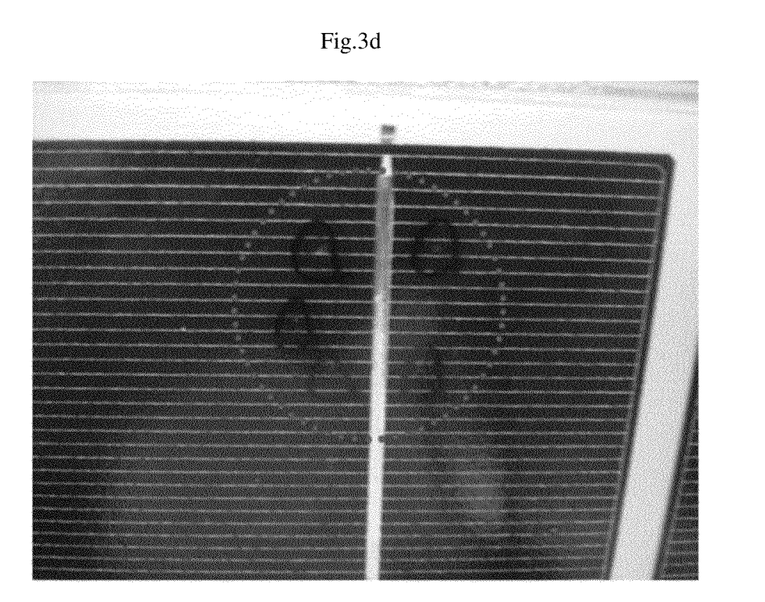
Figure 3E:
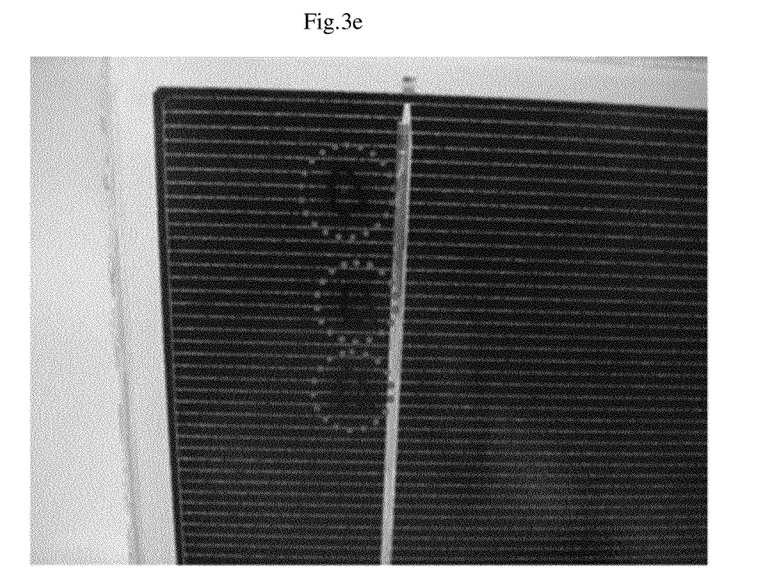

Referring to FIGS. 3a to 3e, bubbles were observed in the solar cell module fabricated using the EVA sheet produced by Mitsui. FIGS. 3a and 3b are images showing bubbles generated from the comparative solar cell module at a vacuum processing time of 2 min. FIGS. 3c to 3e are images showing bubbles generated from the comparative solar cell module at a vacuum processing time of 1 min.

The inventive sheet includes a plurality of pores, through which bubbles are released. That is, all bubbles were released from the inventive sheet even when the vacuum degassing processing time was shortened, indicating high productivity in the fabrication of solar cell modules.

2. Experiment for Thermal Shrinkage Measurement

To investigate the inherent shrinkage of the inventive sheet, a Teflon sheet, which is not bonded to the inventive sheet, was placed on a heater at 145° C., the inventive sheet having a square shape (width=150 mm, length=150 mm) was placed on the Teflon sheet, followed by heating for 20 min. The maximum shrinkage of the inventive sheet was measured.

EVA sheets for sealing member of solar cells produced by other companies were used as comparative sheets. Specifically, an EVA sheet (0.45 t, 3M DYNEON™ E-20101, 3M) was used as Comparative Example 1, an EVA sheet (First™ F806, HZ) was used as Comparative Example 2, an EVA sheet (solar EVA, Mitsui) was used as Comparative Example 3, an EVA sheet produced by Jungwoo Trading Company was used as Comparative Example 4, an EVA sheet (CIK Cap FL, C.I. Kasei) was used as Comparative Example 5, and an EVA sheet (CIK Cap FH, C.I. Kasei) was used as Comparative Example 6. The experimental results for thermal shrinkage are shown in Table 2.

In the results of Table 2, '-' indicates shrinkage. The EVA sheets of Comparative Examples 1-6 were shrunk in the lengthwise direction and were shrunk or slightly extended in the widthwise direction.

Figure 4A:
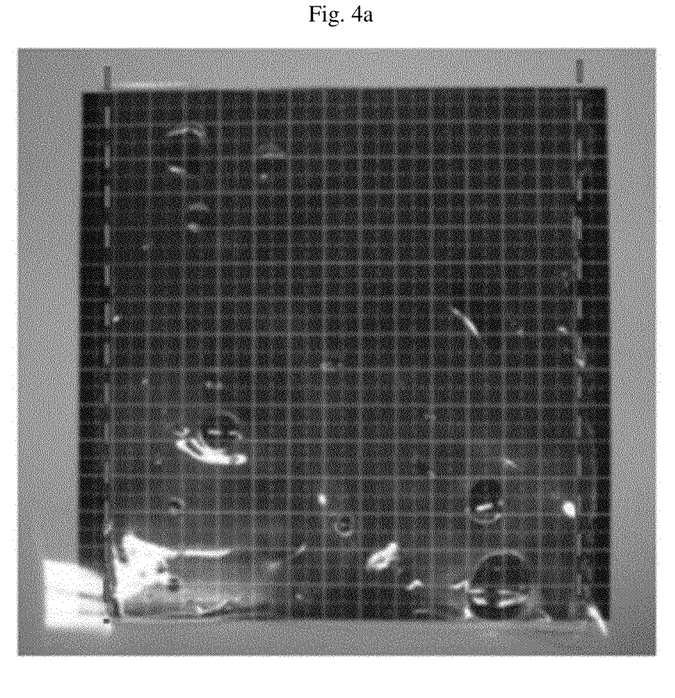
FIGS. 4a to 4h are images showing experimental results comparing the thermal shrinkages of sheets for sealing members of solar cells.
Figure 4B:
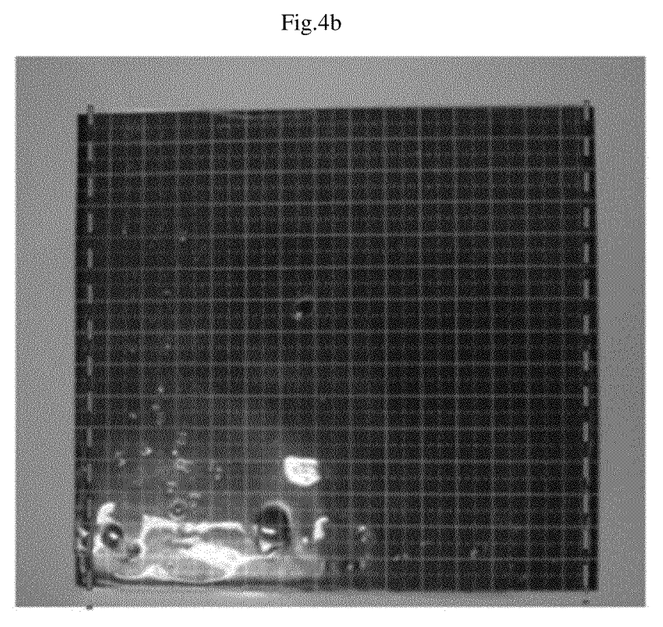
Figure 4C:
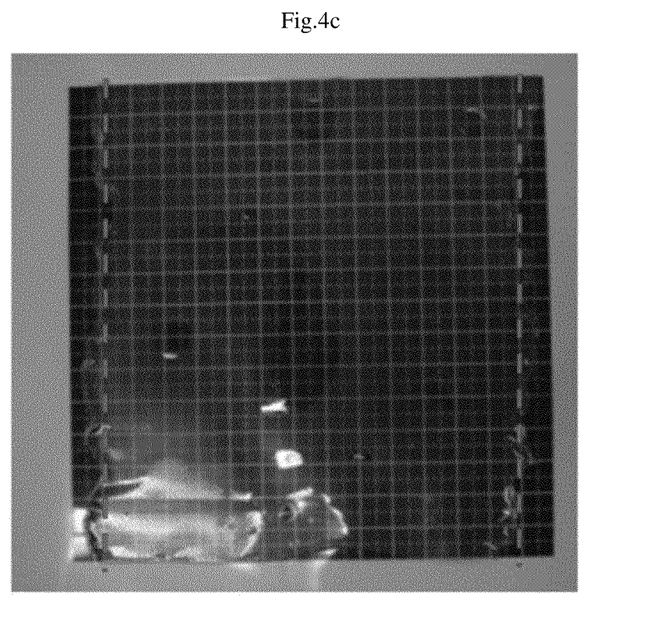
Figure 4D:
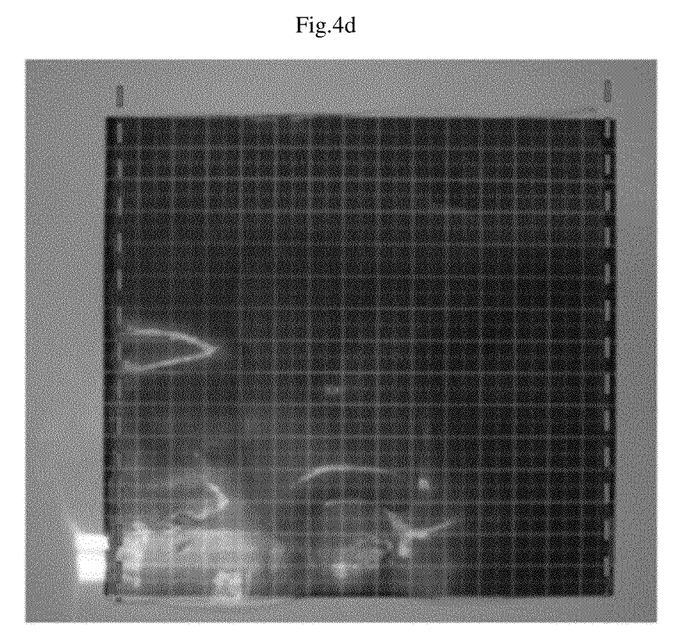
Figure 4E:
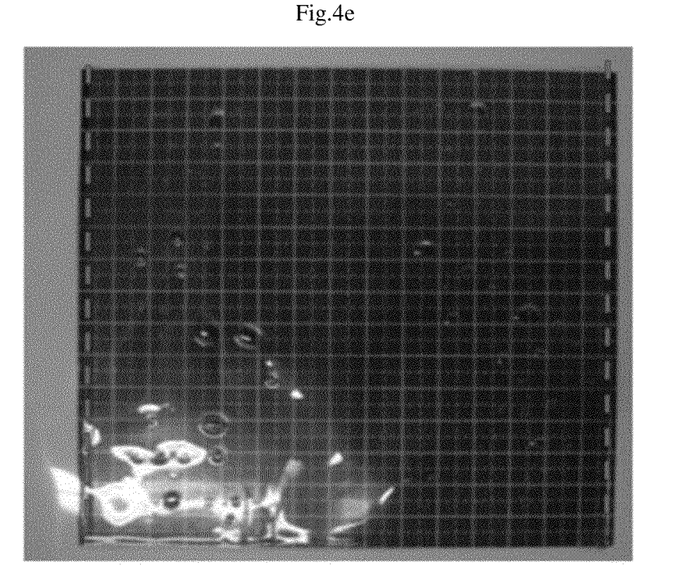
Figure 4F:
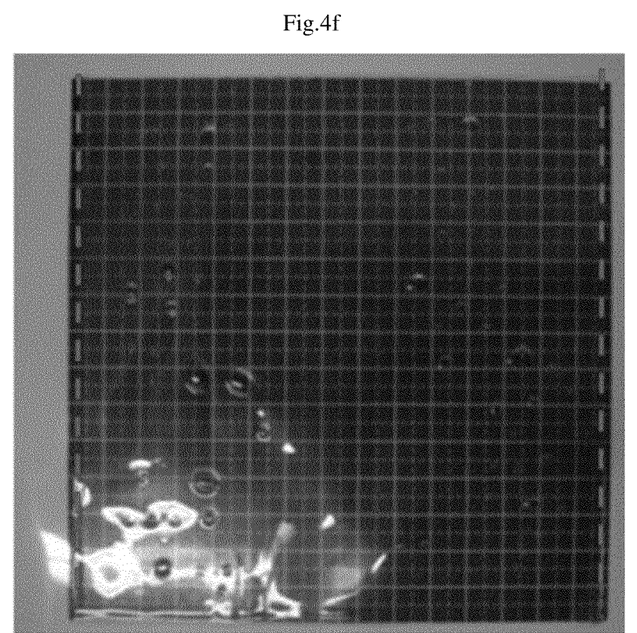
Figure 4G:
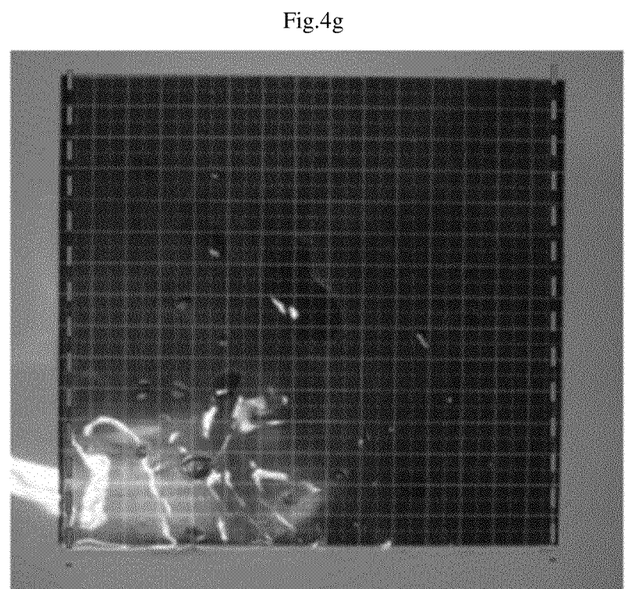
Figure 4H:
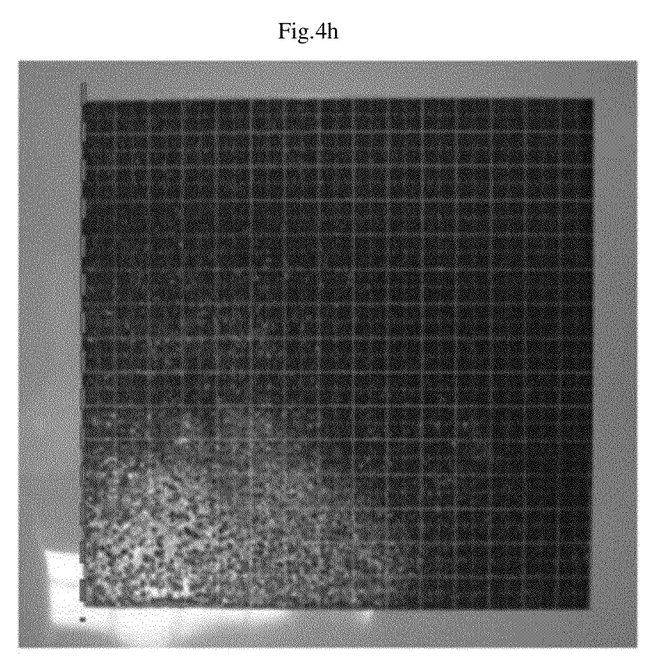

FIGS. 4a to 4h are images showing thermal shrinkages of Comparative Examples 1-6 and Example 1. Specifically, the images of FIGS. 4a to 4g show thermal shrinkages of Comparative Examples 1-6, and the image of FIG. 4h shows thermal shrinkage of Example 1.

The inventive sheet was not deformed in both the lengthwise and widthwise directions due to its very low thermal shrinkage.

The inventive sheet produced by melt-bonding a resin powder had a low thermal shrinkage, unlike the EVA films produced by conventional processes, such as extrusion. Due to the shrinkage difference, the above experimental results were obtained.

3. Measurement of Defect Proportion Depending on the Flexibility of the Sheet for Sealing Member The apparent density D of the sheet of Example 1 was calculated by:

$$D = W/V$$

D: Apparent density (kg/m$^3$)
W: Weight of the sheet per unit area (g/cm$^2$)
V: Volume of the sheet per unit area (cm$^3$/cm$^2$)

The pure density of the thermal adhesive resin used in Example was 948 kg/m$^3$.

The pure density of the sheet produced in Example 1 was 400 kg/m$^3$, which corresponds to 42% of the pure density of the thermal adhesive resin.

The inventive sheet was used to fabricate a solar cell module.

As illustrated in FIG. 1, the solar cell module is fabricated by stacking the sheet 4 on the surface of a front protective member 1 made of glass, stacking a plurality of solar cell devices 3 on the sheet 4, stacking the sheet 4 on the solar cell devices, and stacking a rear protective member 2 made of glass on the sheet 4.

The resulting laminate was set on a laminator for solar cell fabrication, degassed on a hot plate at 130° C. for 3 min under vacuum, and pressurized at a pressure of 1 kgf/cm$^2$ for 5 min.

100 solar cell modules were fabricated under the same conditions as described above. No damage to the solar cell devices 3, no misalignment in the position of the solar cell devices 3, no incorporation of pores, etc. were observed.

That is, no defective products were found.

<Comparative Sheet for Sealing Member>

For comparison with the inventive sheet, a sheet for a sealing member was produced. The apparent density of the sheet exceeded 70% of the pure density of a thermoplastic resin.

The comparative sheet was produced by spreading the thermal adhesive resin powder used in the inventive sheet on a release sheet, and melting the resin powder using a far

TABLE 2

| Kind of EVA | | Comp. Ex. 1 | Comp. Ex. 2 | Comp. Ex. 3 | Comp. Ex. 4 | Comp. Ex. 4 | Comp. Ex. 5 | Ex. 1 |
|---|---|---|---|---|---|---|---|---|
| Deformed length (mm) | Lengthwise direction | -15 | -5 | -17 | -5 | -4 | -4 | 0 |
| | Widthwise direction | 2 | 0 | -1 | -1 | 1 | 1 | 0 | infrared heater. This procedure was the same as in Example 1 except that the heating temperature was set to 145° C.

Due to the higher heating temperature by the far infrared heater, the thermal adhesive resin powder particles were substantially melt-bonded to each other and a small number of pores were formed in the comparative sheet. The comparative sheet had a thickness of 0.45 mm, which is less than half of the thickness of the inventive sheet.

The comparative sheet had a weight of 400 g per unit area ($cm^2$) and an apparent density of 889 $kg/m^3$. That is, the apparent density of the comparative sheet was 94% of the pure density of the thermal adhesive resin and much greater than 70% of the pure density of the thermal adhesive resin.

100 solar cell modules were fabricated using the comparative sheet under the same conditions as in the fabrication of the inventive solar cell modules. Damage to the solar cell devices was observed in two of the 100 solar cell modules.

No misalignment in the position of the solar cell devices was observed but pores were observed in three of the sealing members.

That is, the proportion of defective products was 5%.

The reason for the occurrence of defects in the solar cell modules using the comparative sheet is thought to be as follows.

The comparative sheet failed to obtain sufficient flexibility due to its high apparent density, i.e. low porosity. For this reason, large interstices were formed between the solar cell devices and the sheet during the fabrication of a solar cell module, and could not be filled with the sealing member.

As described above, the comparative sheet had a lower porosity and a smaller thickness than the inventive sheet. For these reasons, poor cushioning of the comparative sheet were obtained, and as a result, the solar cell devices were pressurized during fabrication.

Although some embodiments have been described herein, it will be understood by those skilled in the art that these embodiments are provided for illustration only, and various modifications, changes, alterations and equivalent embodiments can be made without departing from the scope of the present invention. Therefore, the scope and sprit of the present invention should be defined only by the accompanying claims and equivalents thereof.

The invention claimed is:

1. A method for producing a sheet for a sealing member of a solar cell, the method comprising:
   (a) preparing a thermal adhesive resin containing an olefinic resin as a main component,
   (b) pulverizing the thermal adhesive resin into a powder and spreading the powder, and
   (c) heating the thermal adhesive resin powder to a temperature not higher than the melting point of the resin powder to produce a sheet comprising a plurality of pores,
   wherein the olefinic resin comprises an ethylene resin or a propylene resin,
   wherein the ethylene resin contains 60% to 90% by weight of ethylene, and
   wherein the thermal adhesive resin has a melt mass-flow rate of 1 g/10 min to 50 g/10 min.

2. The method according to claim 1, wherein the ethylene resin comprises a polyethylene resin or an ethylene-vinyl acetate copolymer.

3. The method according to claim 1, wherein the thermal adhesive resin further comprises one or more additives selected from the group consisting of cross-linking agents, cross-linking accelerators, silane coupling agents, UV absorbers, light stabilizers, and antioxidants.

4. The method according to claim 1, wherein, in step (b), the resin powder is spread in an amount of 300 to 1000 $g/m^2$.

5. The method according to claim 1, wherein, in step (c), the thermal adhesive resin powder is melt-bonded at 80 to 140.degree. C.

6. The method according to claim 1, wherein the thermal adhesive resin powder has a particle size of 20 to 120 mesh.

7. A sheet for a sealing member of a solar cell, comprising:
   a thermal adhesive resin containing an olefinic resin as a main component,
   wherein the sheet is produced by melt-bonding the thermal adhesive resin in the form of a powder to form pores therein,
   wherein the olefinic resin comprises an ethylene resin or a propylene resin,
   wherein the ethylene resin contains 60% to 90% by weight of ethylene, and
   wherein the thermal adhesive resin has a melt mass-flow rate of 1 g/10 min to 50 g/10 min.

8. The sheet according to claim 7, wherein the ethylene resin comprises a polyethylene resin or an ethylene-vinyl acetate copolymer.

9. The sheet according to claim 7, wherein the sheet is produced by partially melt-bonding the thermal adhesive resin powder.

10. The sheet according to claim 7, wherein the thermal adhesive resin powder is melt-bonded by heating to a temperature not higher than a melting point thereof.

11. The sheet according to claim 7, wherein the apparent density of the sheet is from 20% to 70% of the pure density of the thermal adhesive resin.

12. The sheet according to claim 7, wherein the thermal adhesive resin further comprises one or more additives selected from the group consisting of cross-linking agents, cross-linking accelerators, silane coupling agents, UV absorbers, light stabilizers, and antioxidants.

* * * * *